(12) United States Patent
Wei et al.

(10) Patent No.: US 7,790,537 B2
(45) Date of Patent: Sep. 7, 2010

(54) METHOD FOR CREATING TENSILE STRAIN BY REPEATEDLY APPLIED STRESS MEMORIZATION TECHNIQUES

(75) Inventors: Andy Wei, Dresden (DE); Anthony Mowry, Dresden (DE); Andreas Gehring, Dresden (DE); Maciej Wiatr, Dresden (DE)

(73) Assignee: Globalfoundries Inc., Grand Cayman (KY)

( * ) Notice: Subject to any disclaimer, the term of this patent is extended or adjusted under 35 U.S.C. 154(b) by 56 days.

(21) Appl. No.: 11/937,677

(22) Filed: Nov. 9, 2007

(65) Prior Publication Data
US 2008/0237723 A1 Oct. 2, 2008

(30) Foreign Application Priority Data
Mar. 30, 2007 (DE) .................. 10 2007 015 500

(51) Int. Cl.
*H01L 21/336* (2006.01)
(52) U.S. Cl. .................. 438/197; 438/305; 438/527; 438/528; 438/530; 257/E21.433

(58) Field of Classification Search .................. 438/231, 438/232, 305, 306, 307, 308, 527, 528, 530, 438/197; 257/E21.433
See application file for complete search history.

(56) References Cited

U.S. PATENT DOCUMENTS

| 7,232,731 | B2* | 6/2007 | Lee et al. | 438/305 |
| 7,354,836 | B2* | 4/2008 | Hoentschel et al. | 438/301 |
| 2008/0081471 | A1* | 4/2008 | Press et al. | 438/682 |
| 2008/0124858 | A1* | 5/2008 | Nguyen et al. | 438/217 |

* cited by examiner

*Primary Examiner*—Michael Trinh
(74) *Attorney, Agent, or Firm*—Williams, Morgan & Amerson, P.C.

(57) ABSTRACT

By introducing additional strain-inducing mechanisms on the basis of stress memorization techniques, the performance of NMOS transistors may be significantly increased, thereby reducing the imbalance between PMOS transistors and NMOS transistors. By amorphizing and re-crystallizing the respective material in the presence of a mask layer at various stages of the manufacturing process, a drive current improvement of up to approximately 27% has been observed, with the potential for further performance gain.

11 Claims, 6 Drawing Sheets

METHOD FOR CREATING TENSILE STRAIN BY REPEATEDLY APPLIED STRESS MEMORIZATION TECHNIQUES

BACKGROUND OF THE INVENTION

1. Field of the Invention

Generally, the present disclosure relates to the formation of integrated circuits, and, more particularly, to the formation of transistors having strained channel regions by using stress-inducing sources, such as stressed overlayers and the like, to enhance charge carrier mobility in the channel region of a MOS transistor.

2. Description of the Related Art

Generally, a plurality of process technologies are currently practiced to fabricate integrated circuits, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode located close to the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, the conductivity of the channel region is a dominant factor determining the performance of MOS transistors. Thus, the reduction of the channel length, and associated therewith the reduction of the channel resistivity, is an important design criterion for accomplishing an increase in the operating speed of the integrated circuits.

The continuing shrinkage of the transistor dimensions, however, involves a plurality of issues associated therewith, such as reduced controllability of the channel, also referred to as short channel effects and the like, that have to be addressed so as to not unduly offset the advantages obtained by steadily decreasing the channel length of MOS transistors. For instance, the thickness of the gate insulation layer, typically an oxide-based dielectric, has to be reduced with reducing the gate length, wherein a reduced thickness may result in increased leakage currents, thereby posing limitations for oxide-based gate insulation layers at approximately 1-2 nm. Thus, the continuous size reduction of the critical dimensions, i.e., the gate length of the transistors, necessitates the adaptation and possibly the new development of highly complex process techniques, for example, for compensating for short channel effects with oxide-based gate dielectric scaling being pushed to the limits with respect to tolerable leakage currents. It has therefore been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region so as to produce a corresponding strain in the channel region, which results in a modified mobility for electrons and holes, respectively. For example, creating uniaxial tensile strain in the channel region along the channel length direction for a standard crystallographic orientation increases the mobility of electrons, which, in turn, may directly translate into a corresponding increase in the conductivity. On the other hand, uniaxial compressive strain in the channel region for the same configuration as above may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast powerful semiconductor devices without requiring expensive semiconductor materials, while many of the well-established manufacturing techniques may still be used.

In some approaches, external stress created by, for instance, permanent overlaying layers, spacer elements and the like is used in an attempt to create a desired strain within the channel region. Although a promising approach, the process of creating the strain in the channel region by applying a specified external stress may depend on the efficiency of the stress transfer mechanism for the external stress provided, for instance, by contact layers, spacers and the like into the channel region to create the desired strain therein. Thus, for different transistor types, differently stressed overlayers have to be provided, which may result in a plurality of additional process steps, wherein, in particular, any additional lithography steps may contribute significantly to the overall production costs. Moreover, the amount of stress-inducing material and, in particular, the intrinsic stress thereof may not be arbitrarily increased without requiring significant design alterations. For example, the degree of tensile stress in corresponding portions of the dielectric layer formed above an N-channel transistor may require new developments of respective deposition techniques, while significantly higher compressive stress may be provided by presently established techniques, thereby creating an imbalance with respect to performance of NMOS and PMOS transistors.

In still a further approach, a substantially amorphized region may be formed adjacent to the gate electrode at an intermediate manufacturing stage, which may then be re-crystallized in the presence of a rigid layer formed above the transistor area. During the anneal process for re-crystallizing the lattice, the growth of the crystal will occur under stress conditions created by the overlayer and result in a strained crystal. After the re-crystallization the sacrificial stress layer may be removed, wherein nevertheless a certain amount of strain may be "conserved" in the re-grown lattice portion. This effect is generally known as stress memorization. Although the exact mechanism is not yet fully understood, it is believed that upon re-crystallization of the substantially amorphized material the increased volume of the amorphous material compared to the crystalline material may be substantially maintained to the presence of the rigid surface layer that reduces or prevents the natural volume reduction which would usually occur during the re-crystallization. Hence, the strained re-grown crystalline material may induce a corresponding tensile strain in the region adjacent to the re-crystallized region of increased volume. The tensile strain may thus also be maintained after removal of a portion of all of the rigid surface layer.

Since many efficient strain-inducing mechanisms are available for PMOS transistors, such as embedded strained silicon/germanium material, stressed contact etch stop layers of very high intrinsic compressive stress and the like, respective strain engineering techniques may be desirable to specifically enhance performance of NMOS transistors.

However, currently practiced stress memorization techniques, although providing moderate advantages in device performance, may not provide the potential for significantly extending the limitations of performance gain of NMOS transistors while not unduly contributing to process complexity of the overall manufacturing process.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique for forming transistor elements having a strained channel region by using a stress memorization approach, wherein, in some aspects, two or more anneal processes for reducing crystal damage and/or activating dopants may be combined to obtain a synergetic effect on the overall strain conditions within an active region of the transistor element. In other aspects, a stress memorization approach may be appropriately performed at a specific point of the overall process sequence to thereby enhance the overall effect of the strain-inducing mechanism, wherein, also in this case, two or more memorization processes may be combined to even further enhance the resulting strain. The respective process techniques disclosed herein may be efficiently applied to one type of transistor without substantially negatively affecting transistors of a different conductivity type or transistors in which enhanced strain in the channel region may not be desired. Consequently, according to one aspect, the imbalance with respect to the strain-inducing mechanisms, which may exist between P-channel transistors and N-channel transistors, may be efficiently reduced by applying the combined stress memorization techniques to N-channel transistors, thereby contributing to a significant performance gain.

One illustrative method disclosed herein comprises performing a first implantation process to substantially amorphize a portion of an active region of a first transistor element, wherein the active region has formed thereon a gate electrode structure. The method further comprises performing a first anneal process in the presence of a first mask layer formed above the active region in order to re-crystallize the portion in a strained state. Furthermore, a second implantation process is performed to substantially amorphize at least a part of the portion of the active region and, thereafter, a second anneal process is performed in the presence of a second mask layer that is formed above the active region in order to re-crystallize the substantially amorphized part in a strained state.

A further illustrative method disclosed herein comprises providing an active region for a first transistor, wherein the active region comprises a damaged crystalline structure. The first transistor is in a manufacturing stage corresponding to a state prior to forming a gate electrode or in a manufacturing stage corresponding to a state after the formation of drain and source regions. The method further comprises forming a mask layer above the active region and annealing the active region in the presence of the mask layer to increase strain in the active region.

One illustrative semiconductor device disclosed herein comprises a gate electrode structure formed above an active region of a first transistor. Furthermore, the device comprises a spacer structure formed adjacent to sidewalls of the gate electrode structure, wherein a material density of semiconductor material in the active region decreases below the spacer structure when the distance to a respective sidewall of the gate electrode structure increases.

BRIEF DESCRIPTION OF THE DRAWINGS

The disclosure may be understood by reference to the following description taken in conjunction with the accompanying drawings, in which like reference numerals identify like elements, and in which.

Figure 1A:
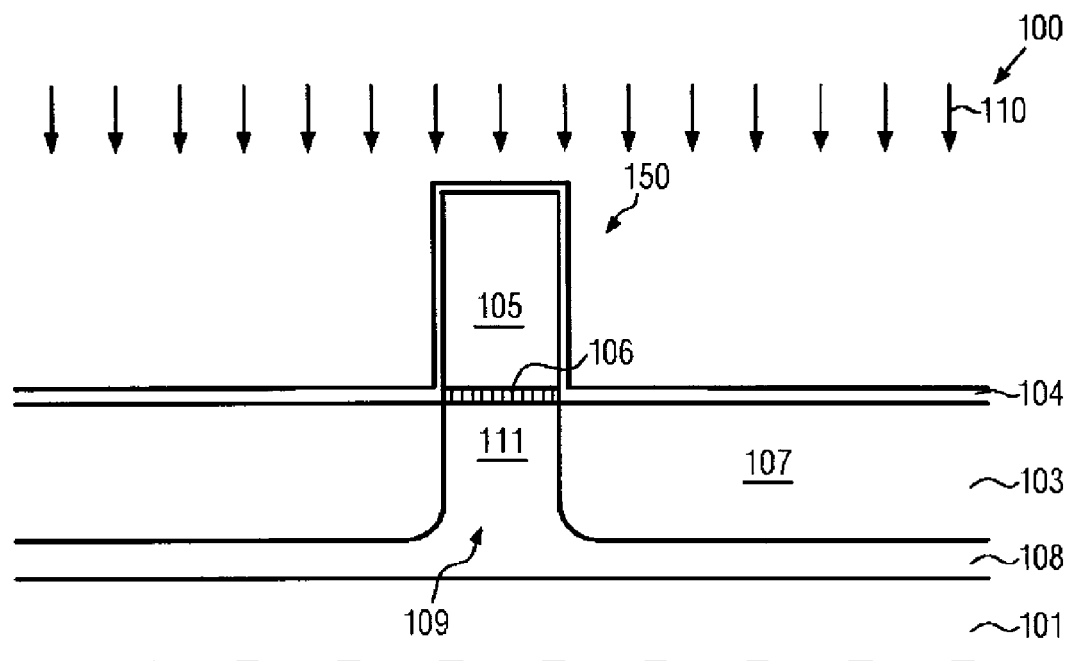
FIGS. 1a-1g schematically illustrate cross-sectional views of a transistor element during various manufacturing stages for increasing a respective tensile strain in accordance with repeated stress memorization processes according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides methods and devices in which stress memorization techniques (SMT) may be efficiently applied during the manufacturing process for forming advanced transistor elements having a strained channel region. It should be appreciated that, in the context of the present disclosure, a stress memorization technique is to be understood as a process in which a semiconductor region, which may comprise a heavily damaged portion or a substantially amorphized portion, may be heat treated at temperatures sufficient to appropriately rebuild the respective crystalline structure, for instance by re-crystallizing the amorphized portion, in order to obtain a strained lattice structure. For this purpose, a corresponding anneal process is performed in the presence of a cap layer that provides appropriate stress conditions in the semiconductor material in order to enable the creation of the strained state of the semiconductor material of the heat treatment, wherein the strained state may even be maintained, in a more or less pronounced degree, when the corresponding cap layer is removed, partially or completely. It is to be appreciated that respective mechanisms for creating a strained semiconductor material on the basis of these techniques may not yet be fully understood yet provide significant advantages with respect to transistor performance, wherein it has been recognized that performing the respective techniques at appropriate points in time during the overall process sequence and/or by appropriately combining various stress memorization processes, a significant additional gain in transistor performance may be obtained, wherein, in some aspects, in particular the performance of NMOS transistors may be improved, thereby providing efficient means for extending the potential for forming advanced semiconductor devices on the basis of planar transistor configurations. In view of the above, it is to be noted that any explanations with respect to the stress memorization processes described herein may be given for illustrative purposes only and should not be considered as restrictive for the devices and process techniques for forming semiconductor devices described herein.

In some illustrative embodiments, the respective strain in an active region of a semiconductor device may be selectively enhanced at an intermediate manufacturing stage by appropriately repeating amorphization and anneal steps on the basis of appropriately designed mask layers. In this intermediate manufacturing stage, in which a transistor element may comprise a gate electrode structure, respective pre-amorphization implantation processes may be performed in order to create heavy damage or even substantially completely amorphize a certain portion of the active region adjacent to the respective gate electrode structure, wherein, in a subsequent anneal step, the re-crystallization process may be performed in the presence of a mask layer providing sufficient rigidity in order to enable a re-crystallization process resulting in a significantly strained state of the re-grown semiconductor material. By removing a portion of the mask layer and repeating the amorphization and anneal sequence, an enhanced strain may be obtained in the newly amorphized and re-grown semiconductor material, thereby also enhancing the overall strain in the active region. This sequence may be repeated as desired in order to adjust a respective final strain in the corresponding transistor element. Consequently, by appropriately accumulating the effect of the stress memorization sequence described above, the respective strain in a specific type of transistor may be enhanced, substantially without affecting other transistors, since the pre-amorphization implantation and/or the mask layer may be selectively applied to the transistor element to be strained, while the other type of transistor may not be substantially affected by the process sequence.

In other aspects, a respective masked anneal process may be performed at a moderately late stage of the process sequence for forming the transistor elements, for instance after the final implantation process for forming drain and source regions, wherein respective anneal parameters may be selected so as to also activate the dopant in the corresponding drain and source regions. Without intending to restrict the subject matter disclosed herein to the following explanation, it is believed that, at these process conditions, a significant diffusion of hydrogen from the mask layer into the drain and source regions may take place, thereby resulting in a significantly strained lattice structure, which may therefore also result in a corresponding strain in the channel region of the respective transistor element. Since the mask layer may be selectively provided above a transistor type of interest, any negative effect on other transistor types may be substantially avoided, thereby also providing an efficient technique for selectively enhancing the performance of a specific transistor type, such as an N-channel transistor.

In other aspects, dedicated areas of a semiconductor material may be exposed to an ion implantation process at an early manufacturing stage, for instance prior to the formation of respective gate electrodes, with a subsequent re-crystallization process on the basis of an appropriate mask layer, as previously described, thereby generating significant strain in the re-grown semiconductor material. Since the respective strain may also be "conserved" at areas which may later be covered by a respective gate electrode, a correspondingly strained lattice structure may thus be maintained directly in the respective channel regions of transistors formed above the previously treated semiconductor material.

In other aspects, two or more of the above-described process techniques may be readily combined with each other in order to even further enhance the overall efficiency, wherein the finally obtained transistor performance gain may even exceed the sum of the individually obtained improvements in transistor performance of the techniques described above. For example, the stress memorization process performed at an intermediate manufacturing stage as described above may be readily combined with a process performed during a respective anneal process designed to activate dopants, as described above, thereby obtaining significant improvements with respect to drive current capability of NMOS transistors.

FIG. 1a schematically illustrates a cross-sectional view of a semiconductor device 100 comprising a substrate 101, which may have formed thereon a semiconductor layer 103, such as a silicon-based semiconductor layer, which may be understood as a semiconductor material comprising a significant amount of silicon, such as 50 atomic percent or more, while other atomic species also may be present, such as germanium, carbon or any other semiconductor alloys, dopants and the like. It should be appreciated that, in some illustrative embodiments, the semiconductor layer 103 may represent an upper portion of the substrate 101, thereby providing a "bulk" configuration, while, in other embodiments, a buried insulating layer (not shown) may be provided between the semiconductor layer 103 and a base material of the substrate 101, thereby providing a silicon-on-insulator (SOI) configuration. Above the semiconductor layer 103, a transistor element 150 may be provided at a specific manufacturing stage, wherein the transistor element 150, i.e., an active region thereof, may be defined by an appropriate isolation structure (not shown), such as a trench isolation or any other appropriate configuration. In one illustrative embodiment, the transistor 150 may represent an N-channel transistor, the performance of which is to be improved by applying a stress memorization technique. The transistor 150 may comprise a gate electrode 105, which may be comprised, for instance in this manufacturing stage, of polycrystalline silicon, while, in other illustrative embodiments, the structure 105 may represent any appropriate place holder structure acting as an implantation mask that may be removed and replaced by an appropriate gate electrode material in a later manufacturing stage. In the embodiment shown, the gate electrode 105 may be separated from a respective channel region 111 by a gate insulation layer 106. A liner material 104 may be formed on exposed portions of the semiconductor layer 103 and on sidewalls and the top of the gate electrode 105. The liner 104 may be comprised of any appropriate material, for instance silicon dioxide and the like. Moreover, respective portions 107 may be formed in the semiconductor layer 103 adjacent to the channel region 111, wherein the portions 107 have a significantly different lattice structure compared to the remaining material of the semiconductor layer 103 and the channel region 111. For instance, the portions 107 may represent a semiconductor material in a substantially amorphized state or may at least comprise heavy lattice damage with a degree that enables an efficient reconfiguration of the lattice structure during a subsequent anneal process. Hence, that portion of the semiconductor layer 103 that may be enclosed by a respective isolation structure (not shown) comprising the portions 107, the channel region 111 and a residual substantially crystalline semiconductor material 108 may be considered as an "active" region 109 of the transistor 150, wherein an active region is to be understood as a semiconductor material having formed therein or still receiving a specific dopant profile so as to appropriately "pattern" the conductivity of the semiconductor material in accordance with the respective device requirements. In the case of the transistor 150, the active region 109 may receive respective PN junctions in a later manufacturing stage in order to provide a controlled charge carrier flow through the channel region 111, thereby enabling a transistor function.

A typical process flow for forming the semiconductor device 100 as shown in FIG. 1a may comprise the following processes. After providing the substrate 101 having formed thereon the semiconductor layer 103, appropriate manufacturing sequences may be performed in order to define the active region 109 in and above which the transistor 150 is to be formed. For example, respective isolation structures, such as shallow trench isolations (STI) (not shown), may be formed on the basis of well-established techniques. Thereafter, any implantation processes may be performed in order to establish the required vertical dopant profile for the transistor 150, for instance with respect to the channel doping, threshold doping and the like.

Thereafter, the gate electrode 105 and the gate insulation layer 106 may be formed on the basis of well-established process techniques. For instance, the gate electrode 105 may be formed on the basis of polysilicon, while the gate insulation layer 106 may be formed on the basis of silicon dioxide, silicon nitride, silicon oxynitride or any other appropriate dielectric materials. Next, the liner 104 may be formed, for instance by oxidation and/or deposition, depending on the device requirements.

Next, an implantation process 110 may be performed in order to create the respective portions 107 of heavily damaged crystalline structure or with a substantially amorphized structure. The implantation process 110 may be performed on the basis of appropriate implant species, such as argon, krypton, xenon and the like, if an electrically inert material is to be used. For instance, xenon may be efficiently used since moderately high crystalline damage may be caused by a xenon implantation even at moderately low implantation doses, thereby reducing the overall process time. Appropriate implantation parameters with respect to implantation dose, energy and the like may be readily established on the basis of simulation calculations and/or experimental data. In some illustrative embodiments, the semiconductor layer 103 may represent the active layer of an SOI substrate so that the average penetration depth and thus implantation energy for the specified implantation species and the material composition of the layer 103 may be selected so as to reliably maintain at least a portion of the substantially crystalline material 108, which may then act as a growth template in a subsequent anneal process. For example, for a thickness of the semiconductor layer 103 in an SOI configuration of approximately 60 nm and more, the corresponding average penetration depth may be selected to be approximately 50 nm, thereby providing the substantially amorphized portions 107 so that they extend through a significant fraction of the semiconductor layer 103, while nevertheless providing a reliable residual crystalline template material, i.e., the material 108. It should be appreciated that appropriate process parameters may be readily adapted to the specific dimensions of the semiconductor layer 103. It should further be appreciated that, during the implantation process 110, other areas of the semiconductor device 100 may be covered in order to substantially avoid heavy crystalline damage in these areas. For instance, respective active regions of P-channel transistors, which may not receive a respectively deep amorphization, may be efficiently covered by a corresponding resist mask, as is also typically used when introducing appropriate dopant species into N-channel transistors and P-channel transistors, respectively. In other illustrative embodiments, the implantation process 110 may comprise the introduction of other appropriate species, such as carbon and the like, in order to also damage the crystalline structure and further enhance the strain transfer mechanism still to be established in the transistor 150. For example, a significant amount of carbon may be incorporated after substantially amorphizing the portions 107 in order to further enhance the generation of a tensile strain in the channel region 111 upon re-crystallizing the portion 107, since a semiconductor alloy comprised of silicon and carbon may have a natural lattice constant that is less compared to the lattice constant of silicon, thereby creating enhanced tensile strain, as will be described later on in more detail.

Figure 1B:
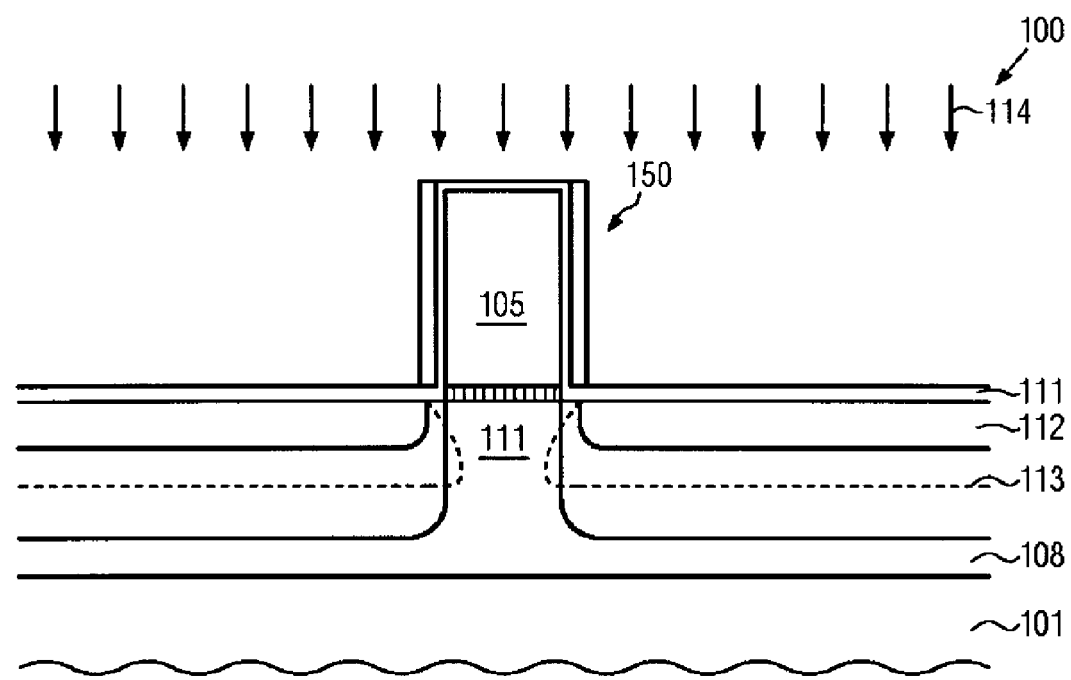

FIG. 1b schematically illustrates the semiconductor device 100 in a further advanced manufacturing stage. At this stage, respective doped regions 112, which may be referred to as drain and source extension regions, may be formed in the active region 109 with an appropriate dopant concentration in accordance with device requirements. For example, the transistor 150 may represent an N-channel transistor and the corresponding extension regions 112 may comprise dopant concentration of an N-dopant of approximately $10^{19}$-$10^{21}$ atoms/cm$^3$. In this manufacturing stage, a respective halo region 113 may also be formed in the active region 109, wherein the halo region 113 may be defined by a dopant having the inverse conductivity type compared to dopants defining the conductivity of the extension regions 112. Furthermore, depending on the device requirements, a respective offset spacer 111 may be formed adjacent to the liner 104 at the sidewalls of the gate electrode 105. In other illustrative embodiments, a thickness of the liner 104 may be selected such that it may also provide a desired offset of the extension regions 112 with respect to the channel region 111.

The semiconductor device 100 as shown in FIG. 1b may be formed on the basis of the following process sequence. After creating the heavily damaged portions 107, the offset spacer 111 may be formed, if required, by depositing an appropriate material, such as silicon dioxide, silicon oxynitride and the like, in a conformal deposition process and subsequently anisotropically etching the material layer in order to obtain the spacers 111. Thereafter, an implantation sequence 114 may be performed in order to create the halo region 113, wherein implantation steps with a tilt angle may be used to provide the desired lateral dopant profile of the halo regions 113. Thereafter, a further step in the process sequence 114 may include the introduction of an appropriate dopant species, such as an N-dopant species, as previously explained. It should be appreciated that the process sequence 114 may be performed prior to forming the heavily damaged portion 107, when, for instance, an increased offset with respect to the channel region 111 may be desirable, for instance in view of damaging the gate insulation layer 106 during the process 110. In the illustrative embodiments shown in FIGS. 1a-1b, the process sequence 114 is performed after the amorphization implantation 110, thereby providing a substantially amorphized semiconductor material in the portions 107, which may efficiently reduce any channeling effects which may occur in a substantially crystalline target material. Thus, the respective profiles of the halo region 113 and the extension regions 112 may be obtained based on well-defined process conditions, thereby improving the pre-anneal dopant gradient at a PN junction defined by the halo region 113 and the extension region 112.

Figure 1C:
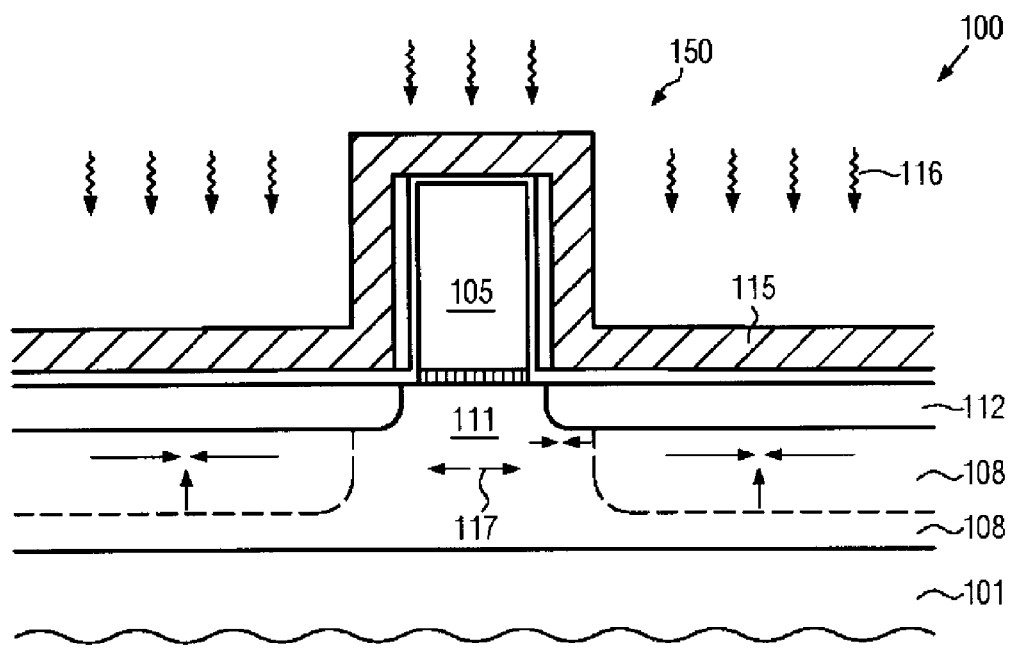

FIG. 1c schematically illustrates the semiconductor device 100 during an anneal process 116 designed to re-crystallize the substantially amorphized portions 107, wherein additionally an appropriate mask layer 115 is formed above the active region 109 in order to enable the creation of a corresponding strain 117 in the channel region 111. The mask layer 115 may be comprised of any appropriate material, such as silicon nitride, silicon oxynitride, silicon dioxide, silicon carbide, nitrogen-enriched silicon carbide and the like. The mask layer 115 may represent a substantially rigid material in the sense that exposed portions of the semiconductor layer 103 and thus of the substantially amorphized portions 107 may be protected so as to substantially reduce a significant reconfiguration of the volume in the semiconductor layer 103. For example, silicon nitride is well known as being a rigid material which, when deposited on an underlying silicon-based material, may substantially suppress any relative material redistribution at the interface between the silicon nitride and the silicon-based material, except for a thermally induced global expansion or contraction of the silicon nitride material. Consequently, the mask layer 115 may efficiently confine the heavily damaged material in the portions 107, which may have a reduced density and thus increased volume compared to the initial crystalline semiconductor material of the semiconductor layer 103.

The mask layer 115 may be formed on the basis of any well-established process technique, such as plasma enhanced chemical vapor deposition (PECVD), high density PECVD and the like. A thickness of the mask layer 115 may be selected in accordance with process and device requirements and may range from approximately 50-100 nm for transistor elements in which the gate length, i.e., in FIG. 1c, the horizontal extension of the gate electrode 105, may be approximately 50 nm and less. However, other appropriate values for the thickness of the mask layer 115 may be readily determined for other devices and process requirements. In some illustrative embodiments, the mask layer 115 may itself be provided with a high intrinsic stress that is appropriate to further enhance the resulting strain 117 obtained in the channel region 111 upon re-crystallizing the portions 107 during the anneal process 116. For example, well-established process recipes may be used for a plurality of dielectric materials, such as silicon nitride, nitrogen-containing silicon carbide and the like, in order to create a desired intrinsic stress depending on respective deposition parameters, such as pressure, temperature, ion bombardment during deposition and the like. For instance, the mask layer 115 may be formed with intrinsic tensile stress when the transistor 150 represents an N-channel transistor.

Thereafter, the anneal process 116 may be performed on the basis of appropriate process parameters, such as duration and temperature, in order to initiate the re-crystallization of the portion 107 substantially without effecting a significant diffusion of dopants contained in the halo region 113 and the extension region 112. In some illustrative embodiments, the anneal process 116 may be performed at a temperature in the range of 580-850° C. with a duration of approximately 5 hours to a few seconds, depending on the specific temperature. In some illustrative embodiments, the anneal process 116 may be performed prior to introducing respective dopants in P-channel transistors, which may typically exhibit an increased diffusivity compared to the diffusivity of typical N-dopants, so that the anneal process 116 may substantially not affect P-channel transistors. Consequently, during the anneal process 116 based on moderately low anneal temperatures, the substantially amorphized material in the portion 107 may be reconfigured so as to take on the crystalline structure as provided by the template material 108, wherein the mask layer 115 may substantially suppress a respective increase of density and thus a reduction of volume of the re-grown material in the portions 107. Consequently, the respective re-grown crystalline material may be provided in a strained state having the tendency to contract, since its natural density would be higher due to the substantially crystalline configuration. Thus, the respective strained state may also affect the channel region 111, thereby creating the respective tensile strain 117 therein. Since the strained state of the re-grown material in the portion 107 may be strongly "coupled" to the material 108 and thus any underlying material, such as a buried insulating layer or further crystalline substrate material, even a complete or partial removal of the mask layer 115 may nevertheless provide a significant remaining strained state and thus for a respective tensile strain 117 in the channel region 111. Consequently, the strain 117 may be created "internally" within the active region 109 on the basis of the above-described mechanism, thereby providing an additional strain-inducing source, especially for N-channel transistors, thereby overcoming the limitations of strain-inducing mechanisms, such as stressed contact etch stop layers, as is previously described. For this reason, a significant performance gain may be obtained on the basis of the above-described process technique.

Figure 1D:
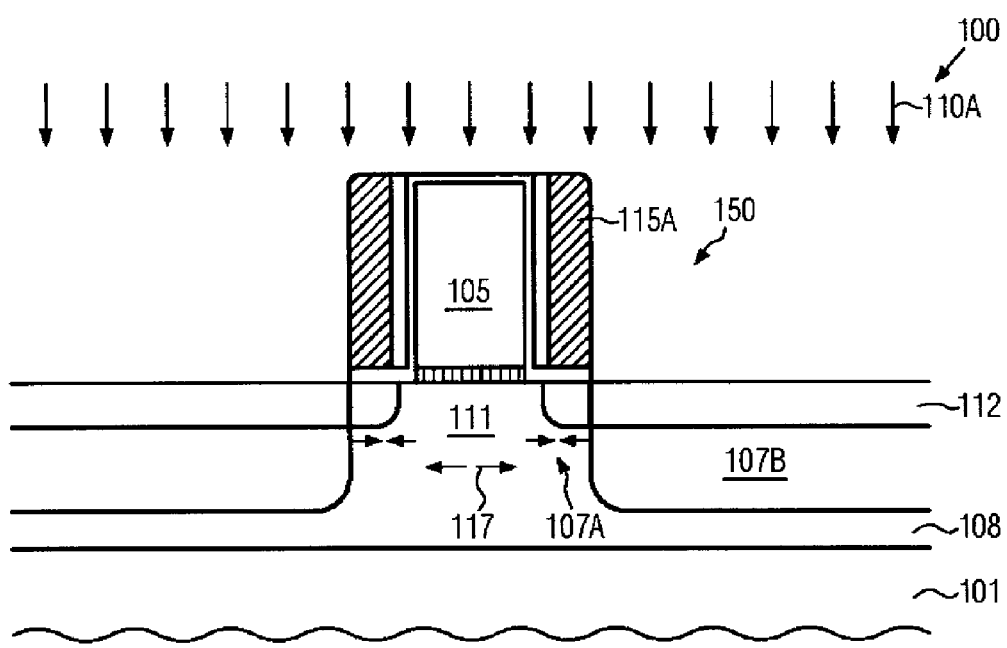

FIG. 1d schematically illustrates the semiconductor device 100 in a further advanced manufacturing stage. The device 100 may comprise a sidewall spacer 115A, which may represent a portion of the mask layer 115 (FIG. 1c). Furthermore, a heavily damaged or substantially amorphized portion 107B may be formed in the active region 109, wherein the lateral dimensions of the substantially amorphized portions 107B may be determined by the spacer element 115A. The portions 107B may be formed on the basis of an appropriately designed ion implantation 110A, which may be performed on the basis of substantially the same process parameters as previously explained with reference to the implantation process 110. Hence, the crystalline material provided in a substantially strained state after the re-crystallization of the previously amorphized portion 107 may be partially amorphized during the process 110A down to any appropriate depth, as previously explained. Due to the provision of the spacers 115A, which may have been formed by anisotropically etching the mask layer 115 on the basis of any appropriate etch recipe, a portion 107A of strained crystalline semiconductor material may be maintained.

Figure 1E:
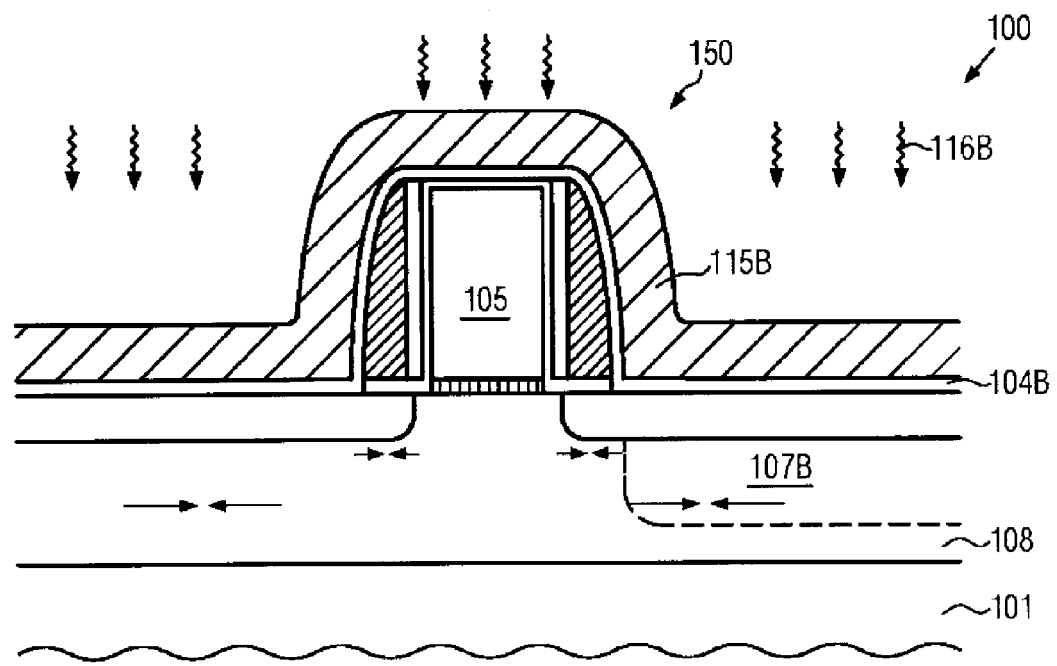

FIG. 1e schematically illustrates the semiconductor device 100 in a further advanced manufacturing stage, wherein a further mask layer 115B may be formed above the transistor 150, wherein the mask layer 115B may substantially meet the same requirements with respect to material composition, layer thickness and the like as previously explained with reference to the mask layer 115. If required, an appropriate liner material 104B, which may exhibit a moderately high etch selectivity with respect to the material of the mask layer 115B, may be formed prior to the deposition of the layer 1115B. For instance, silicon dioxide and silicon nitride may be used for the layers 104B, 115B, respectively, wherein other material compositions may also be used, depending on the process and device requirements. After the deposition of the mask layer 115B, a further anneal process 116B may be performed, wherein similar process parameters may be used, as previously described. Hence, during the process 116B, a significant diffusion of dopants may be suppressed, while nevertheless a substantially amorphized material in the portion 107B may be re-crystallized, wherein also the mask layer 115B may suppress a shrinkage of the increasingly formed crystalline material, thereby further enhancing the overall strained state of the semiconductor material. Consequently, the respective strain in the channel region 111 may also be enhanced, thereby providing increased charge carrier mobility, which may directly translate into a respective increase of drive current capability.

Figure 1F:
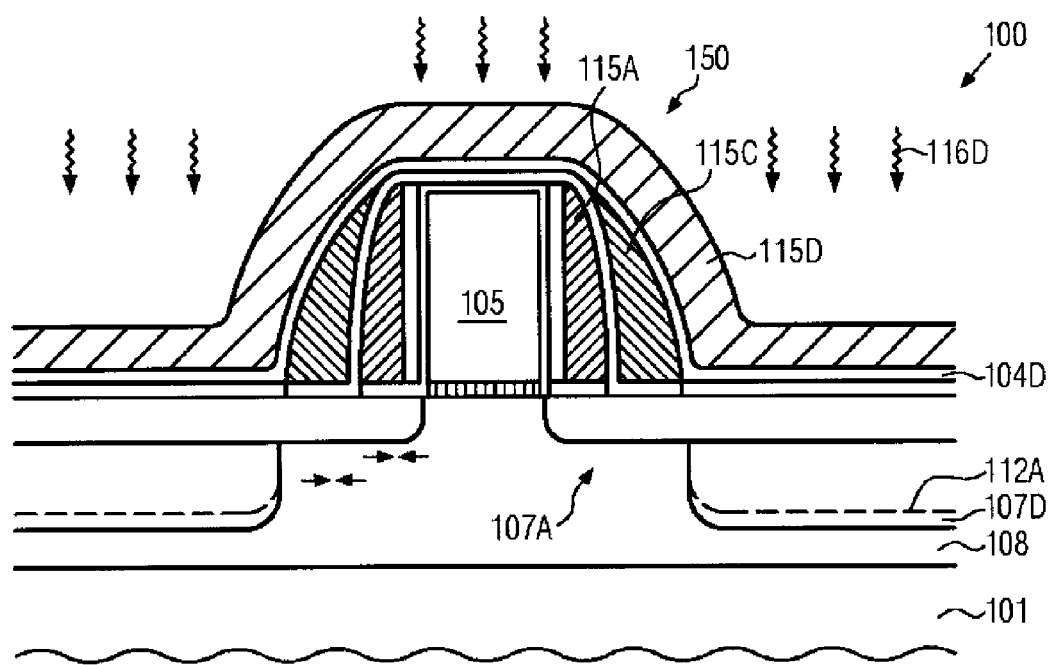

FIG. 1f schematically illustrates the semiconductor device 100 according to a further illustrative embodiment, in which a further substantially amorphized portion 107D may be provided in the active region 109. Furthermore, the gate electrode 105 may comprise a further sidewall spacer element 115C, which may represent a portion of the previously used mask layer 115B. Moreover, a further mask layer 115D, possibly in combination with a respective liner material 104D, may encapsulate the transistor 150 to provide the desired re-crystallization conditions during a further anneal process 116D. As previously explained with reference to the amorphized portion 107B, the portion 107D may also be created on the basis of an appropriately designed implantation process, wherein the combined width of the spacers 115A, 115C substantially determines the lateral size of the portion 107D. Consequently, the size of the portion 107A comprising a substantially crystalline semiconductor material in a highly strained state may now be defined by the combined width of the spacers 105A, 105C. Moreover, a corresponding density of the substantially crystalline material below the spacer 115C may even be less compared to material located below the spacer 115A due to the preceding process sequence including the implantation 110B and the anneal process 116B. Similarly, the portion 107D may be efficiently re-crystallized during the anneal process 116D, thereby also creating a further strained state of the re-grown semiconductor material, which may result in a further increased overall strain in the channel region 111. Consequently, each "pair" of a spacer element and a corresponding re-grown portion obtained by a correspondingly performed amorphization implantation and anneal process may contribute to a further increase of the overall strain in the device 150. The above-described process sequence may be repeated as required in order to adjust a finally desired strain in the transistor 150.

For instance, for an N-channel transistor having a specific device configuration, for instance a gate length of 50 nm and less, the corresponding drain/source saturation current may be increased by approximately 2-3% compared to a conventional device formed without the above-described sequence of stress memorization mechanisms. Consequently, with the above-described sequence as shown in FIG. 1f, a corresponding improvement of roughly 8-10% may be obtained with the potential of further increasing the corresponding transistor performance by providing an even increased number of stress memorization cycles.

In the embodiments described above with reference to FIGS. 1a-1f, further appropriate implantation steps may be performed at any appropriate intermediate configuration of the resulting spacer structure defined by the spacers 115A, 115C and by additional spacers that may be formed from the mask layer 115E in order to obtain a desired lateral profile of drain and source regions. For instance, after forming the spacers 115C, a corresponding implantation step may be performed, for instance after the respective amorphization implantation step for defining the portion 107D so as to obtain deep drain and source regions, as indicated by the dashed line 112A. In other cases, respective implantation steps for introducing the appropriate doping material may be performed after each step of forming the respective spacers 115A, 115C or any further additional spacer elements, when highly sophisticated lateral profiles are required. In some illustrative embodiments, the corresponding spacer structure, for instance comprising the spacer elements 115A, 115C and the like, may also be formed in other transistor devices, such as P-channel transistors, wherein respective implantation processes may also be performed in order to introduce the corresponding dopant species into these transistor devices. Thus, the corresponding spacer structure 115A, 115C and optional further spacers may be efficiently used for profiling the drain and source regions of P-channel transistors and N-channel transistors at the same time, wherein a corresponding amorphization implantation may not be performed in the P-channel transistors or may be performed with a significantly reduced average penetration depth, thereby substantially avoiding any strain-inducing effects in the P-channel transistors while nevertheless providing a high tensile strain in the transistor 150, as previously explained.

If a corresponding influence of the respective anneal processes, such as the processes 116, 116B, 116D, are considered inappropriate with respect to dopant diffusion in the P-channel transistors, the sequence for forming the spacers 115A, 115C may be restricted to the transistor 150 and the corresponding mask material may be completely removed from other transistors not requiring the corresponding spacer elements. For instance, any undesired spacer elements in other transistor elements may be removed on the basis of wet chemical etch techniques, while covering the transistor 150 by a corresponding etch mask, such as a resist mask. For example, silicon nitride may be efficiently removed on the basis of hot phosphoric acid. Thus, the strain-inducing mechanism as explained above may be efficiently restricted to one type of transistor while not significantly affecting other transistor elements. Moreover, in the above-described process sequence, additional mechanisms may be used so as to further enhance the overall strain-inducing mechanism. For example, as previously explained, carbon material may be introduced into the respective substantially amorphized portions 107, 107B, 107D, which may further enhance the finally obtained strain, since silicon/carbon may exhibit an increased atomic density compared to substantially pure silicon, thereby further increasing the tendency to contract upon recrystallizing from the substantially amorphized state. Similarly, the respective mask layers, or at least some of them, may be provided with high intrinsic stress and may therefore also increase the overall efficiency of the stress memorization techniques described above.

Figure 1G:
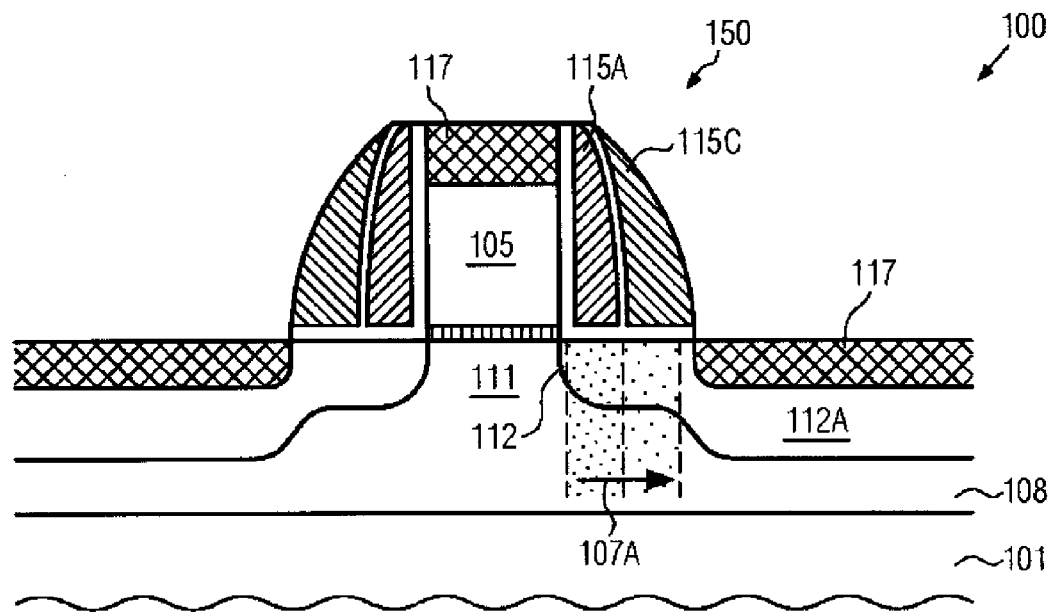

FIG. 1g schematically illustrates the transistor 150 in a substantially completed manufacturing stage. Here, respective metal silicide regions 117 may be formed in the gate electrode 105 and the drain and source regions 112A, wherein the lateral offset of the metal silicide regions 117 in the drain and source regions 112A may be substantially determined by the spacers 115A, 115C. In other illustrative embodiments, the lateral spacing may be defined by newly formed spacer structures, or one or both of the structures 115A, 115C may be removed prior to forming the metal silicide regions 117 in order to reduce the overall series resistance. The metal silicide regions 117 may be formed on the basis of well-established process techniques. Similarly, the drain and source regions 112A may be formed on the basis of implantation sequences, as previously described, possibly using the respective spacers 115A, 115C and possibly any further spacer elements for obtaining the desired lateral profiling, wherein an appropriately designed final anneal process may be performed so as to activate dopants in the drain and source regions 112A with a desired degree. For example, sophisticated anneal techniques, such as spike anneal processes, radiation-based processes such as laser- and flash-based processes, and the like, may be used. In some illustrative embodiments, the corresponding final activation anneal processes may be performed on the basis of an appropriately designed mask layer so as to further enhance the respective strain, as will be described later on with reference to FIG. 2. The respective density of the crystalline material of the region 107A may decrease below the spacers 15A, 115B in the lateral direction, as indicated by the shaded areas, wherein the arrow shown indicates the direction of decreasing density. In this case, both areas may contribute to an enhanced tensile strain.

Furthermore, the transistor 150 may comprise substantially crystalline semiconductor material of reduced density due to the strained state of this material, wherein a corresponding degree of density may decrease with an increase of the distance from the channel region 111, as is indicated by 107A. As previously explained, each stress memorization cycle may result in a reduced density of the respective strained semiconductor material located below the respective spacer elements 115A, 115C, thereby also producing an increased overall strain in the channel region 111. Thus, as previously explained, the corresponding drive current capability may be efficiently adjusted on the basis of the number of stress memorization steps performed.

Figure 1H:
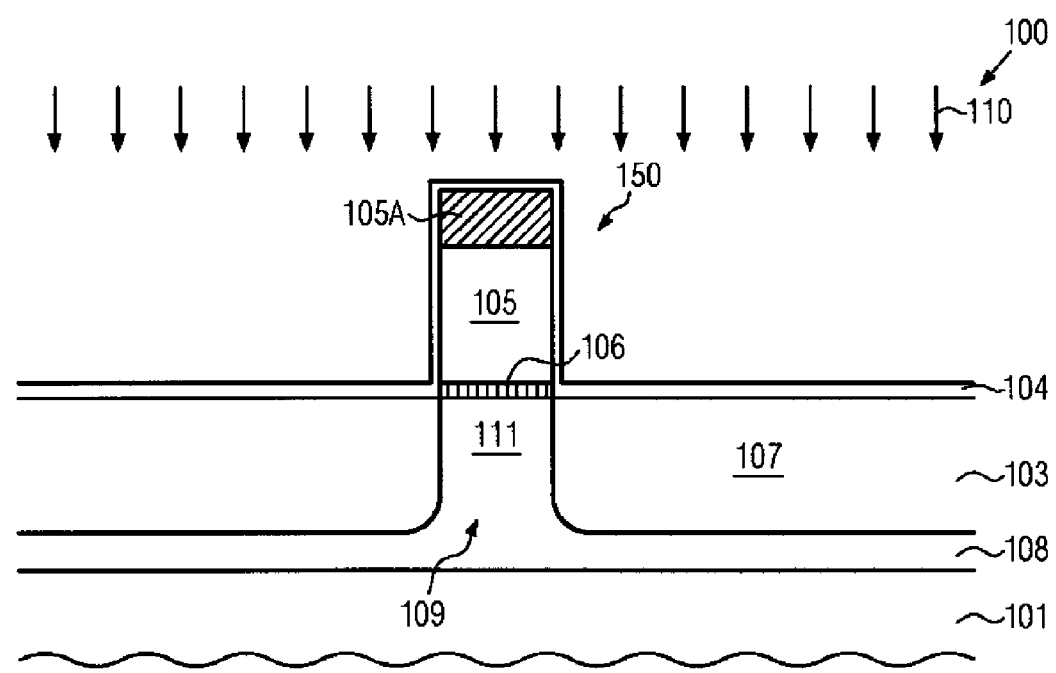
FIG. 1h schematically illustrates a cross-sectional view of the transistor element according to another illustrative embodiment in which the effect of amorphization may be reduced in the respective gate electrode.

FIG. 1h schematically illustrates the semiconductor device 100 according to a further illustrative embodiment, in which the effect of the amorphization implantation 110 on the gate electrode 105 may be reduced if a corresponding amorphization of the substantially polycrystalline material in the gate electrode 105 may be considered inappropriate. For this purpose, an appropriate cap layer 105A may be formed during the patterning of the gate electrode 105 with an appropriate thickness so as to efficiently reduce the penetration of the respective implantation species. For instance, the cap layer 105A may be comprised of silicon nitride, silicon oxynitride and the like, and may also be used as anti-reflecting coating (ARC) material during the preceding patterning of the gate electrode material for forming the gate electrode 105. Consequently, during the corresponding stress memorization cycles, the gate electrode 105 may maintain its polycrystalline configuration, thereby providing a substantial "neutral" behavior with respect to the strain in the channel region 111.

Figure 2:
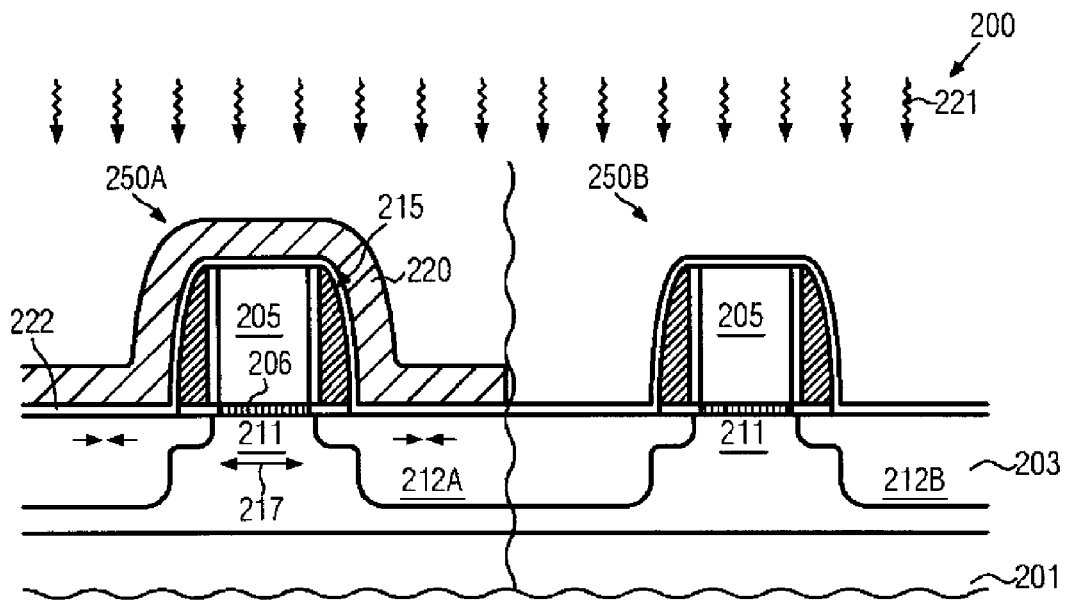
FIG. 2 schematically illustrates a cross-sectional view of a semiconductor device including transistors of different conductivity type, wherein an efficient strain-inducing mechanism may be obtained selectively in one transistor at a manufacturing stage after final implantations for forming drain and source regions, according to other illustrative embodiments.

FIG. 2 schematically illustrates a cross-sectional view of a semiconductor device 200 in an advanced manufacturing stage. The semiconductor device 200 may comprise a first transistor 250A and a second transistor 250B, which may represent transistors of different conductivity types or transistors of different configuration, which may require a different type or amount of strain. In one illustrative embodiment, the first transistor 250A may represent an N-channel transistor and the transistor 250B may represent a P-channel transistor. The first and second transistors 250A, 250B may comprise a gate electrode 205 formed on a corresponding gate insulation layer 206 that separates the gate electrode 205 from a respective channel region 211. Furthermore, drain and source regions 212A are formed in an active region defined in a respective semiconductor layer 203 that is formed above a substrate 201. Furthermore, a buried insulating layer (not shown) may be provided between the substrate 201 and the semiconductor layer 203, when an SOI configuration is considered. Furthermore, a respective spacer structure 215 may be formed on sidewalls of the gate electrode 205, wherein a width of the spacer structure 215 may correspond to the lateral dopant profile in the drain and source regions 212A. With respect to the components described so far, the same criteria apply as previously explained with reference to the semiconductor device 100.

The semiconductor device 200 may comprise a mask layer 220, possibly in combination with a respective liner material 222, wherein the mask layer 220 may cover the first transistor 250A, while exposing the second transistor 250B, that is, exposing the liner 222, if provided. In some illustrative embodiments, the semiconductor device 200 may be formed in accordance with well-established CMOS techniques, except for the liner 222 and the mask layer 215, and hence a respective description of the corresponding manufacturing processes will be omitted here. In other illustrative embodiments, the first transistor 250A may be formed in accordance with process techniques as previously described with reference to the transistor 150, thereby creating a respective strain 217 in the channel region 211. That is, during the formation of the transistor 250A, at least one stress memorization process may have been performed, as previously described, in order to create the strain 217. On the other hand, the second transistor 250B may remain substantially unaffected by the corresponding stress memorization processes, as is also previously explained. After forming the drain and source regions 212A, which may include respective process steps for forming the spacer structure 215 so as to provide the desired lateral profiling during the respective implantation processes, the liner 222, if required, and the mask layer 220 may be formed for instance by depositing an appropriate material for the liner 222, such as silicon dioxide, and depositing an appropriate material having a desired high etch selectivity with respect to the liner material 222 or the semiconductor material of the layer 203, if the liner 222 is not provided. For example, silicon dioxide may be deposited with a thickness of approximately 5-10 nm followed by deposition of an appropriate mask material, such as silicon nitride, with a thickness of approximately 10-70 nm. In other cases, other appropriate materials, such as silicon carbide, nitrogen-enriched silicon carbide and the like, may be used. For depositing and patterning the mask layer 220, any appropriate deposition and etch techniques may be used as are well known in the art.

In some illustrative embodiments, the drain and source regions 212A may have a substantially crystalline silicon-based material due to preceding anneal processes for re-crystallizing substantially amorphized portions, as previously explained with reference to the device 100, while still a high degree of dopant atoms may be located at interstitial sites. In other cases, the drain and source regions 212A may be provided in a highly damaged or substantially amorphized portion due to any preceding implantation cycles for introducing the respective dopants. At any rate, an efficient activation of dopants may be required in this manufacturing stage, i.e., respective dopant atoms have to be positioned at regular lattice sites in order to provide the high conductivity desired. For this purpose, an anneal process 221 may be performed with appropriate process parameters to provide temperatures in the range of 1000-1300° C., thereby providing efficient activation of dopant atoms. The corresponding anneal time may be selected relatively short and even ultra-fast anneal processes, such as laser-based and flashlight-based anneal processes, may be used. In this case, a significant diffusion of the dopant species may be suppressed while nevertheless providing a high degree of dopant activation. During the anneal process 221, performed on the basis of the mask layer 220, a significant generation of strain may occur in the first transistor 250A, thereby providing tensile strain 217 or enhancing a previously established tensile strain, when the semiconductor device 200 has been formed on the basis of one or more stress memorization cycles, as previously described with reference to the device 100.

It is believed that, during the anneal process 221, a significant out-diffusion of hydrogen atoms from the mask layer 220 into the lower lying source and drain regions may occur and may result in a corresponding strain. Although the exact mechanism is still not fully understood, the respective strain-inducing mechanism may be controlled on the basis of well-defined process parameters with respect to the anneal process 221 and the characteristics of the mask layer 220 and the corresponding process parameters for forming the same. Consequently, a well-controllable additional strain-inducing mechanism may be obtained using the mask layer 220 during the anneal process 221, while an efficient dopant activation may also occur in the second transistor 250B while not affecting the respective strain state thereof. That is, the second transistor 250B may have included therein appropriate strain-inducing mechanisms, such as strained semiconductor alloys, such as silicon/germanium and the like, in order to generate a respective strain in the channel region according to the device requirements. Moreover, as previously explained, highly efficient mechanisms for compressively stressed overlayers may be available, thereby creating a desired high amount of strain in the second transistor 250B. Consequently, the stress memorization process provided by the mask layer 220 and the anneal process 221 may enable a controlled adjustment of the strain in the first transistor 250A so as to further enhance the transistor performance without negatively affecting the second transistor 250B, thereby providing the potential for reducing the imbalance of strain-inducing mechanisms between P-channel transistors and N-channel transistors, as previously explained.

After the process 221, the mask layer 220 may be removed, for instance on the basis of hot phosphoric acid, and subsequently the liner 222 may be removed and the further processing may be continued on the basis of conventional techniques, i.e., by cleaning the resulting surface and forming respective metal silicide regions, as previously described. For otherwise identical transistor characteristics, the drive current capability of the transistor 250A may be improved for process parameters as specified above by approximately 9-12% compared to a transistor formed without the above-described stress memorization technique. Furthermore, in combination with one or more of the respective stress memorization processes as previously described with reference to the transistor 150, an increase of drive current has been demonstrated to be as high as approximately 27% with the potential for further improvements.

Figure 3A:
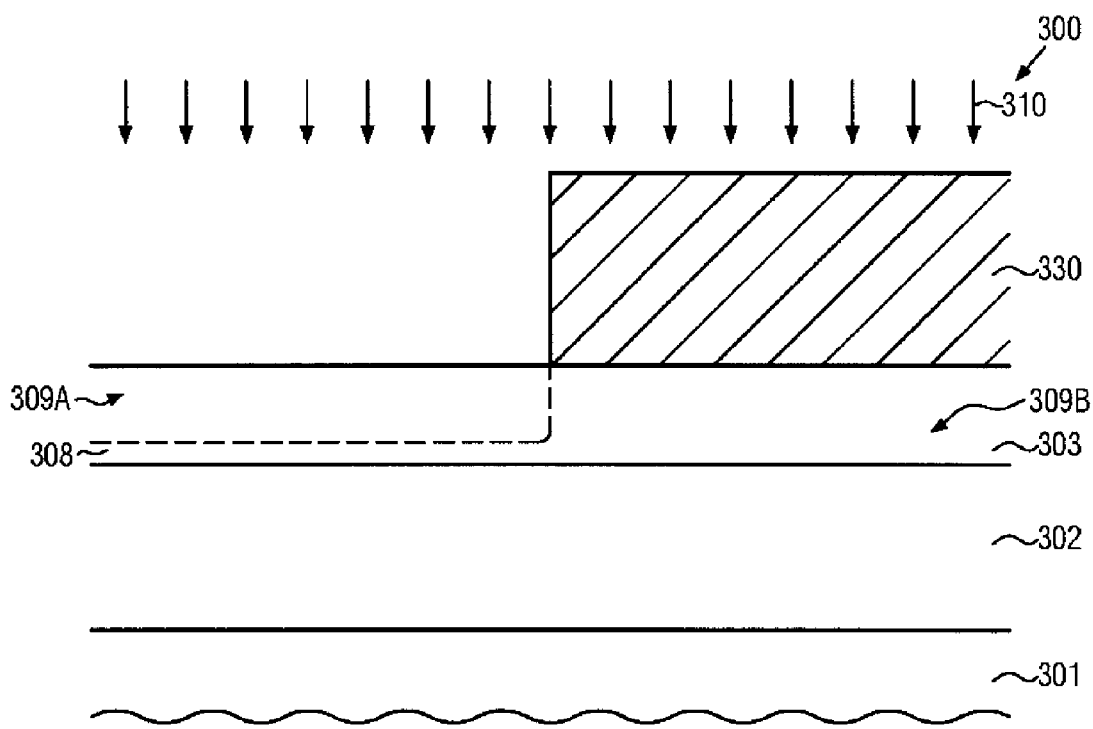
FIGS. 3a-3c schematically illustrate cross-sectional views of a semiconductor device according to still further illustrative embodiments, wherein a stress memorization technique may be used in an early manufacturing stage prior to the formation of respective gate electrodes.
Figure 3B:
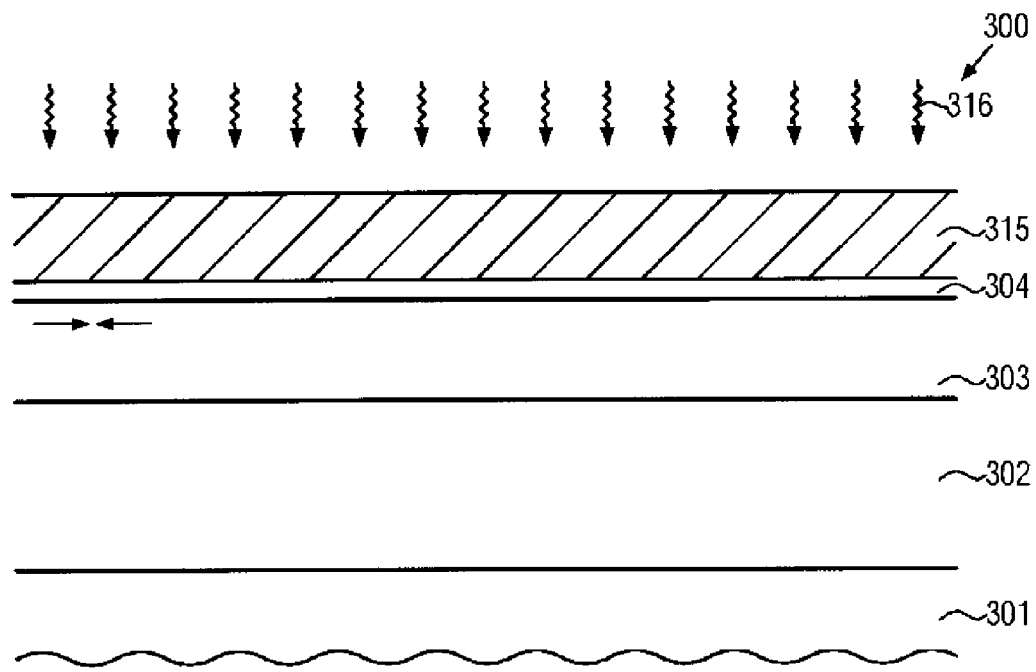
Figure 3C:
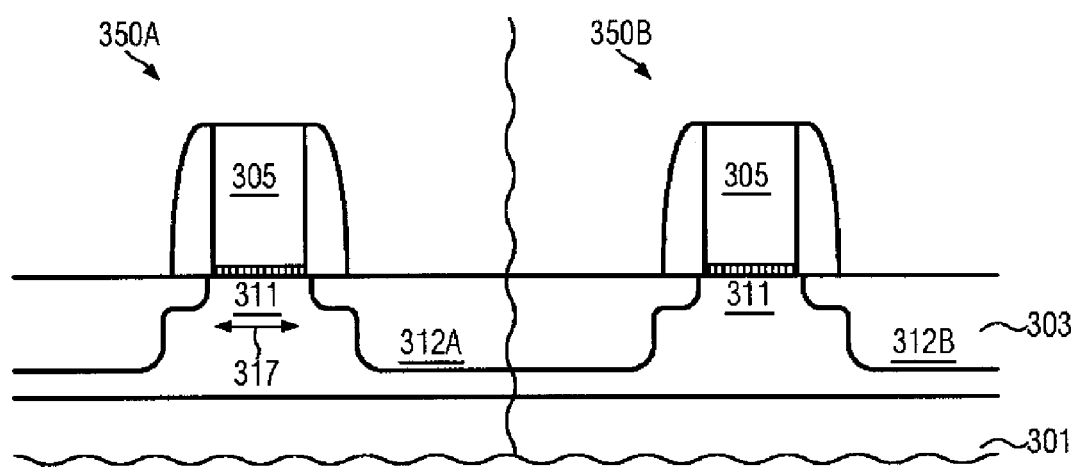

With reference to FIGS. 3a-3c, further illustrative embodiments will now be described in which a corresponding stress memorization technique may be performed at an early manufacturing stage.

FIG. 3a schematically illustrates a cross-sectional view of a semiconductor device 300 comprising a substrate 301, above which is formed a silicon-based semiconductor layer 303. Furthermore, a buried insulating layer 302 may be provided between the semiconductor layer 303 and the remaining substrate material of the substrate 301. In the semiconductor layer 303, a first active region 309A and a second active region 309B may be defined, for instance on the basis of a resist mask 330. With respect to the components described so far, the same criteria apply as previously referred to for the devices 100 and 200. Furthermore, the device 300 may be subjected to an implantation process 310 designed to substantially amorphize a portion of the first active region 309A down to a specified depth so as to maintain a certain amount of substantially crystalline material 308. With respect to any process parameters for the process 310, the same criteria apply as previously explained with reference to the implantation processes 110, 110B and the like. Thereafter, the resist mask 330 may be removed on the basis of well-established process techniques.

FIG. 3b schematically illustrates the semiconductor device 300 in a further advanced manufacturing stage in which the first and second active regions 309A, 309B may be covered by a corresponding mask layer 315, wherein a respective liner material 304 may be provided, if required. As previously explained, the mask layer 315, in combination with the layer 304, may provide a rigid material for encapsulating the substantially amorphized portion of the active layer 309A. With respect to process techniques for forming the layers 304 and 315, the same criteria apply as previously explained with reference to the mask layers 115 and 215. Next, the semiconductor device 300 may be subjected to an anneal process 316 on the basis of any appropriate process parameters so as to initiate an efficient re-crystallization of the substantially amorphized portion in the first active region 309A. Thus, as previously explained, the corresponding re-grown semiconductor material in the first active region 309A may be re-grown in a highly strained state, which may be maintained to a certain degree even after removal of the layers 304 and 315. For instance, the material in the first active region 309A may be grown with reduced density and thus increased volume compared to the initial silicon-based material.

FIG. 3c schematically illustrates the semiconductor device 300 in an advanced manufacturing stage. A first transistor 350A may be formed in and above the first active region 309A, while a second transistor 350B may be formed in and above the second active region 309B. During the process of forming the transistors 350A, 350B, conventional CMOS techniques may be used wherein, contrary to conventional concepts, the first transistor 350A may be formed on the basis of a strained silicon-based material, wherein at least the respective channel region 311 may substantially remain in its initially created strain even though respective implantation processes may reduce or relax the corresponding strain in the adjacent drain and source regions during the corresponding process sequence. Thus, since the channel region 311 may have included therein at least a certain degree of the initially created strain, the corresponding charge carrier mobility may be significantly improved compared to conventional strategies. Furthermore, during the corresponding manufacturing process for forming the transistors 350A, 350B, one or more of the stress memorization techniques previously described with reference to the devices 100 and 200 may also be used, thereby even further enhancing the resulting strain in the channel region 311. Consequently, a further strain-inducing mechanism may be provided in order to even further enhance the strain in N-channel transistors, thereby reducing any imbalance with respect to strain-inducing mechanisms compared to P-channel transistors.

It should be appreciated that, in any of the embodiments described above, the further processing of the transistor devices may be continued by forming appropriately stressed dielectric materials above the respective transistor elements, such as stressed contact etch stop layers, stressed interlayer dielectric material and the like, so as to further enhance the overall strain in the respective transistor elements, wherein the stress memorization techniques disclosed herein may provide a significant enhancement of transistor performance of N-channel transistors.

As a result, the subject matter disclosed herein provides additional strain-inducing mechanisms on the basis of stress memorization techniques, wherein respective mask layers may be selectively provided above respective transistors, such as N-channel transistors, in order to form a strained semiconductor material adjacent to the channel region and, in some illustrative embodiments, also within the channel region, thereby also creating a respective tensile strain in the channel region. The respective stress memorization processes disclosed herein may be advantageously combined so as to even further enhance the overall performance gain, wherein the combined result may even exceed the respective results of the individual strain-inducing mechanisms.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    performing a first implantation process to substantially amorphize a portion of an active region of a first transistor element;
    forming a first mask layer above said active region;
    performing a first anneal process in the presence of said first mask layer to re-crystallize said portion in a strained state;
    removing at least a portion of said first mask layer;
    forming a second mask layer above said active region;
    after performing said first anneal process, performing a second implantation process to substantially amorphize at least a part of said portion of said active region, and
    performing a second anneal process in the presence of said second mask layer to re-crystallize said part in a strained state.

2. The method of claim 1, further comprising forming an extension region in said active region prior to performing said first anneal process.

3. The method of claim 1, wherein removing at least a portion of said first mask layer further comprises removing said first mask layer from above said portion.

4. The method of claim 1, wherein removing at least a portion of said first mask layer further comprises removing said portion of said first mask layer to maintain a first spacer structure on sidewalls of a gate electrode structure formed on said active region.

5. The method of claim 4, further comprising removing a portion of said second mask layer to maintain a second spacer structure adjacent to said first spacer structure.

6. The method of claim 5, wherein at least one of said first and second spacer structures are used as an implantation mask for introducing a dopant species for forming drain and source regions of said transistor device.

7. The method of claim 1, further comprising covering a second transistor during said first and second implantation processes.

8. The method of claim 7, wherein the first and second anneal processes are performed prior to forming drain and source extension regions in said second transistor.

9. The method of claim 1, further comprising providing a cap layer above a gate electrode structure formed on said active region prior to performing said first and second implantation processes.

10. The method of claim 1, further comprising forming drain and source regions in said active region, forming a third mask layer above said first transistor element, and annealing said first transistor element in the presence of said third mask layer to active dopants in said drain and source regions.

11. The method of claim 10, wherein forming said third mask layer comprises forming a material layer above said first transistor element and a second transistor and removing a portion of said material layer from above said second transistor.

* * * * *